(12) United States Patent
Miura

(10) Patent No.: US 7,465,657 B2
(45) Date of Patent: Dec. 16, 2008

(54) METHOD OF MANUFACTURING A SEMICONDUCTOR DEVICE HAVING A CAPACITOR

(75) Inventor: Jiro Miura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/826,252

(22) Filed: Jul. 13, 2007

(65) Prior Publication Data

US 2007/0259454 A1 Nov. 8, 2007

Related U.S. Application Data

(62) Division of application No. 10/372,325, filed on Feb. 25, 2003, now Pat. No. 7,259,416.

(30) Foreign Application Priority Data

May 29, 2002 (JP) .............................. 2002-156291

(51) Int. Cl.
*H01L 21/4763* (2006.01)
*H01L 21/00* (2006.01)
*H01L 21/8242* (2006.01)

(52) U.S. Cl. .......................... 438/622; 438/3; 438/240; 438/254

(58) Field of Classification Search ............... 438/3, 438/239, 240, 253, 254, 622; 257/295, 303–306, 257/760, 751
See application file for complete search history.

(56) References Cited

U.S. PATENT DOCUMENTS

| | | | |
|---|---|---|---|
| 5,773,314 A | 6/1998 | Jiang et al. | |
| 5,796,136 A | 8/1998 | Shinkawata | |
| 5,990,507 A | 11/1999 | Mochizuki et al. | |
| 6,043,529 A | 3/2000 | Hartner et al. | |
| 6,249,054 B1 | 6/2001 | Tanigawa | |
| 6,291,250 B1 | 9/2001 | Igarashi | |
| 6,339,008 B1 | 1/2002 | Takenaka | |
| 6,407,422 B1 | 6/2002 | Asano et al. | |
| 6,441,420 B1 | 8/2002 | Nagano et al. | |

(Continued)

FOREIGN PATENT DOCUMENTS

JP 10-303398 11/1998

(Continued)

OTHER PUBLICATIONS

Japanese Office Action dated Sep. 30, 2008 of JP 2002-156291.

*Primary Examiner*—Shouxiang Hu
(74) *Attorney, Agent, or Firm*—Westerman, Hattori, Daniels & Adrian, LLP.

(57) ABSTRACT

There is provided a semiconductor device that comprises a first impurity diffusion region formed on a silicon substrate (semiconductor substrate), a first interlayer insulating film (first insulating film) formed over the silicon substrate, a first hole formed in the first interlayer insulating film, a first conductive plug formed in the first hole and connected electrically to the first impurity diffusion region and having an end portion protruded from an upper surface of the first interlayer insulating film, a conductive oxygen barrier film formed to wrap the end portion of the first conductive plug, and a capacitor formed by laminating a capacitor lower electrode, a capacitor dielectric film, and a capacitor upper electrode sequentially on the conductive oxygen barrier film.

16 Claims, 10 Drawing Sheets

U.S. PATENT DOCUMENTS

| | | |
|---|---|---|
| 6,509,601 B1 | 1/2003 | Lee et al. |
| 6,576,941 B1 | 6/2003 | Lee et al. |
| 6,579,727 B1 | 6/2003 | Zambrano |
| 6,914,336 B2 * | 7/2005 | Matsuki et al. ............ 257/769 |
| 2001/0007365 A1 | 7/2001 | Lee |
| 2001/0035550 A1 | 11/2001 | Yamazaki et al. |
| 2002/0066921 A1 | 6/2002 | Sitaram et al. |
| 2003/0077858 A1 * | 4/2003 | Lian et al. .................. 438/240 |
| 2007/0042596 A1 * | 2/2007 | McTeer ..................... 438/622 |

FOREIGN PATENT DOCUMENTS

| | | |
|---|---|---|
| JP | 2000-138349 | 5/2000 |
| JP | 2000-307071 | 11/2000 |
| JP | 2000-349252 | 12/2000 |
| JP | 2000-349255 | 12/2000 |
| JP | 2001-501375 | 1/2001 |
| JP | 2001-44376 | 2/2001 |

\* cited by examiner

METHOD OF MANUFACTURING A SEMICONDUCTOR DEVICE HAVING A CAPACITOR

This application is a divisional of prior application Ser. No. 10/372,325 filed Feb. 25, 2003, the entire contents of which is hereby incorporated by reference.

CROSS-REFERENCE TO RELATED APPLICATIONS

This application is based upon and claims priority of Japanese Patent Application No. 2002-156291, filed on May 29, 2002, the contents being incorporated herein by reference.

BACKGROUND OF THE INVENTION

1. Field of the Invention

The present invention relates to a semiconductor device and a method of manufacturing the same and, more particularly, a semiconductor device having a capacitor and a method of manufacturing the same.

2. Description of the Related Art

The ferroelectric capacitor of FeRAM (Ferroelectric Random Access Memory) that is currently mass-produced has the planar structure.

However, the capacitor having the stacked structure that can reduce the cell area smaller is required in future in reply to the request for the higher integration. The stacked structure has the conductive plug, which gives the contact to the semiconductor substrate, directly under the lower electrode of the ferroelectric capacitor. As set forth in Patent Application Publication (KOKAI) 2001-44376, for example, normally the tungsten or the polysilicon is employed as the material of the conductive plug.

Meanwhile, most of FeRAM products are hybridly integrated with the logic product. In the logic semiconductor device, normally the process using the tungsten plug to connect the lower conductive pattern and the upper conductive pattern is employed. The resistance value of the tungsten plug is of course employed as the spice parameter to design the circuit.

Therefore, it is preferable that, with regard to the significances of practical use of accumulated circuit design resources and reduction in development man-hour/cost, the tungsten plug should be employed as the contact plug in the FeRAM, which is hybridly integrated with the logic product, like the prior art.

Next, steps of forming the stacked capacitor that is connected to the top surface of the tungsten plug in the FeRAM memory cell will be explained hereunder.

First, steps required until a structure shown in FIG. 1A is formed will be explained hereunder.

A device isolation insulating film 102 is formed around an element forming region of a silicon substrate 101, and then a well 103 is formed in the element forming region. Then, two MOS transistors 104 are formed in the well 103.

Each of the MOS transistors 104 has a gate electrode 104b, which is formed on the well 103 via a gate insulating film 104a, and impurity diffusion regions 104c, 104d, which are formed in the well 103 on both sides of the gate electrode 104b and act as the source/drain. Also, sidewall spacers 105, which are used to form high-concentration impurity regions 104d in the impurity diffusion regions 104c, are formed on both side surfaces of the gate electrode 104b.

Then, an interlayer insulating film 107 for covering the MOS transistors 104 is formed on the silicon substrate 101.

Then, contact holes 107a are formed in the interlayer insulating film 107 on one impurity diffusion regions 104c of the MOS transistors 104. Then, a tungsten film 108 is formed in the contact holes 107a and the interlayer insulating film 107.

Then, as shown in FIG. 1B, the tungsten film 108 formed on the interlayer insulating film 107 is removed by the CMP (Chemical Mechanical Polishing) method. Then, the tungsten film 108 left in the contact holes 107a is used as a contact plug 108a respectively.

Then, as shown in FIG. 1C, a first metal film 109, a ferroelectric film 110, and a second metal film 111 are formed on the contact plugs 108a and the interlayer insulating film 107.

Then, ferroelectric capacitors 112 are formed by patterning the first metal film 109, the ferroelectric film 110, and the second metal film 111 by virtue of the photolithography method. In each of the ferroelectric capacitors 112, the first metal film 109 is used as the lower electrode, and the second metal film 111 is used as the upper electrode. The ferroelectric capacitor 112 is the stacked capacitor, and the lower electrode 109a is connected to one impurity diffusion region 104c of the MOS transistor 104 via the underlying contact plug 108a.

Now, consideration will be given to the contact plugs 108a formed directly under the ferroelectric capacitors 112.

The CMP process is executed at the time of the contact plug formation. At that time, if the tungsten film 108 is still left on the interlayer insulating film 107 after the CMP, short-circuit between the contact plugs 108a may occur. In order to avoid such circumstance, the CMP is executed to attain the slight over-etching. As a result, as shown in FIG. 1B, erosion or recess is generated around the contact plugs 108a to cause level difference, and simultaneously upper surfaces of the contact plugs 108a are polished. This level difference causes a minute concave portion in the lower electrode 109, which exerts a bad influence on the crystallization of the overlying ferroelectric film 110. Thus, in some cases the polarization characteristic of the ferroelectric film 110 is deteriorated.

Also, in the steps of forming the ferroelectric capacitors 112 and subsequent steps, various annealing steps such as the crystallization annealing, the recover annealing, etc. are needed.

Meanwhile, as set forth in Patent Application Publication (KOKAI) Hei 10-303398, when the tungsten is used as the material of the contact plug formed directly under the ferroelectric capacitor, the tungsten plug is oxidized at a very quick speed and at a low temperature to cause the defective contact between the tungsten plug and the lower electrode. Also, when polysilicon is used as the material of the contact plug formed directly under the ferroelectric capacitor, the polysilicon is also oxidized, though not to the degree of the tungsten. The oxidation spreads over the entire contact plug once such oxidation occurs, so that the defective contact is easily caused and thus reduction in yield of the FeRAM device is caused.

In this manner, though various annealing steps are required to improve the performance of the ferroelectric capacitor, nevertheless the temperature must be lowered to some extent so as to cause the contact plug formed directly under the ferroelectric capacitor to operate normally.

As a result, improvement in the performance of the ferroelectric capacitor and improvement in the contact performance of the contact plug are in the trade-off relationship.

In addition, as the technology of maintaining the performance of the ferroelectric capacitor in the prior art, the structure for connecting the contact plug and the lower electrode via the barrier metal and covering the barrier metal under the lower electrode with the oxidation-preventing insulating film is set forth in Patent Application Publication (KOKAI) 2000-138349 and Patent Application Publication (KOKAI) 2000-

349252. In order to form such structure, the polishing step of planarizing upper surfaces of both the barrier metal and the surrounding insulating film is added. In this case, like the case shown in FIG. 1B, there is a possibility that, because of difference in the polishing speed between the insulating film and the barrier metal, the erosion and the recess are caused. In addition, the step of forming the barrier metal and the insulating film and the step of polishing the barrier metal are added and also alignment margin of the barrier metal to the contact plug must be considered. Thus, the above structure is unstable for the miniaturization.

Further, to form the oxidation-preventing barrier metal layer in the contact hole and over the conductive plug as the oxidation-preventing structure of the contact plug is set forth in Patent Application Publication (KOKAI) 2000-349255 and Patent Application Publication (KOHYO) 2001-501375. However, according to such structure, it is difficult to assure selectively the space, into which the barrier metal layer is buried, over the contact hole.

SUMMARY OF THE INVENTION

It is an object of the present invention to provide a semiconductor device and a method of manufacturing the same, capable of improving contact between a capacitor lower electrode and a contact plug.

According to one aspect of the present invention to provide a semiconductor device comprising a first impurity diffusion region formed in a surface layer of a semiconductor substrate; a first insulating film formed over the semiconductor substrate; a first hole formed in the first insulating film; a first conductive plug formed in the first hole, and connected electrically to the first impurity diffusion region, and having an end portion that is protruded from an upper surface of the first insulating film; a conductive oxygen barrier film formed on the first insulating film and the first conductive plug to wrap the end portion of the first conductive plug and having a flat upper surface; and a capacitor formed by laminating a capacitor lower electrode, a capacitor dielectric film, and a capacitor upper electrode sequentially on the conductive oxygen barrier film.

Next, advantages of the present invention will be explained hereunder.

According to the present invention, the end portion of the first conductive plug is covered with the conductive oxygen barrier film. Therefore, the oxygen is hard to enter into the first conductive plug, and thus the abnormal oxidation of the first conductive plug in various annealing steps can be prevented.

In addition, the conductive oxygen barrier film is formed so as to wrap the end portion of the first conductive plug therein. Therefore, the contact areas between the conductive oxygen barrier film and the first conductive plug can be increased, and thus contact characteristics of them can be improved.

Further, the second hole may be formed in the first insulating film, and also the second conductive plug whose end portion is protruded upward higher than the upper surface of the first insulating film may be formed in the second hole. In this case, when the insulating oxygen barrier film that covers the side surface of the end portion of the second conductive plug is formed, the abnormal oxidation of the second conductive plug can be prevented.

Moreover, the side surface of the conductive oxygen barrier film may be covered with the side surface of the insulating oxygen barrier film. By employing such a structure, even if the conductive oxygen barrier film is formed substantially equal in size to the first conductive plugs, the oxygen can be prevented from entering from the side surfaces and thus generation of the abnormal oxidation of the first conductive plugs can be prevented.

Besides, the above insulating oxygen barrier film may be formed of the laminated film consisting of a plurality of films. In this case, peeling-off between the lower electrode and the insulating oxygen barrier film can be prevented by forming an insulating adhesion film as the uppermost layer film, and forming the part of the lower electrode of the capacitor on the insulating adhesion film.

According to one aspect of the present invention to provide a semiconductor device manufacturing method comprising the steps of forming a first impurity diffusion region in a surface layer of a semiconductor substrate; forming a first insulating film over the semiconductor substrate; forming a first hole over the first impurity diffusion region by patterning the first insulating film; forming a first conductive plug, which is connected electrically to the first impurity diffusion region and an upper end portion of which is protruded upward from an upper surface of the first insulating film, in the first hole; forming a conductive oxygen barrier film on the first conductive plug and the first insulating film; patterning the conductive oxygen barrier film to leave the conductive oxygen barrier film to cover the upper end portion of the first conductive plug; forming an insulating oxygen barrier film on the first insulating film and the conductive oxygen barrier film; polishing the insulating oxygen barrier film to expose a surface of the conductive oxygen barrier film such that each upper surface of the conductive oxygen barrier film and the insulating oxygen barrier film constitute a continuous flat surface; forming a capacitor lower electrode conductive film on the flat surface; forming a ferroelectric film on the capacitor lower electrode conductive film; forming a capacitor upper electrode conductive film on the ferroelectric film; and forming a capacitor, which is constructed by laminating sequentially a capacitor lower electrode, a capacitor dielectric film, and a capacitor upper electrode, by patterning the capacitor upper electrode conductive film, the ferroelectric film, and the capacitor lower electrode conductive film.

Next, advantages of the present invention will be explained hereunder.

According to the present invention, since each upper surface of the conductive oxygen barrier film and the insulating oxygen barrier film are formed as the continuous flat surface and also the capacitor lower electrode conductive film is formed on the flat surface, the upper surface of the capacitor lower electrode conductive film has also the flat shape. Therefore, since the lower electrode conductive film does not exert a bad influence upon the crystallization of the ferroelectric film formed thereon, it can be prevented that the polarization characteristic of the ferroelectric film is deteriorated.

In addition, the conductive oxygen barrier film is formed in the situation that the end portion of the first conductive plug is projected from the upper surface of the first insulating film. Therefore, the crack of the crystal of the conductive oxygen barrier film can be prevented.

Further, when the insulating oxygen barrier film is polished, the conductive oxygen barrier film has already been patterned and thus is electrically isolated on the first conductive plug. Therefore, each upper surface of the conductive oxygen barrier film and the insulating oxygen barrier film can be planarized by using the conductive oxygen barrier film as the polishing stopper film.

In this case, it is preferable that before the conductive oxygen barrier film is patterned, the sacrifice film is formed on the conductive oxygen barrier film and then the conductive oxygen barrier film is planarized by etching back the sacrifice film and the conductive oxygen barrier film. This provides more flat upper surfaces of each of the insulating oxygen barrier film and the conductive oxygen barrier film when polishing the insulating oxygen film.

Furthermore, since the sacrifice film is formed by the spin coating, such sacrifice film can absorb unevenness of the upper surface of the underlying conductive oxygen barrier film, so that it is possible to planarize the upper surface of the sacrifice film more easily. Therefore, the upper surface of the conductive oxygen barrier film after the etching-back can be planarized more easily.

Moreover, when formation of the sacrifice film is executed separately at plural times by the spin coating, the film thickness at each time can be formed thin and thus a distribution of the film thickness at each time does not become worse. Therefore, it can be prevented that the final distribution of the film thickness of the sacrifice film becomes worse.

Besides, when the film whose selective etching ratio to the conductive oxygen barrier film is about 1:1 is employed as the sacrifice film, the flat upper surface of the sacrifice film before the etching-back can be transferred onto the conductive oxygen barrier film.

In order to cause the end portion of the first conductive plug to protrude from the upper surface of the first insulating film, after the plug conductive film is formed in the first hole and the first insulating film, the first polishing step of selectively polishing the plug conductive film under first polishing conditions to remove from the upper surface of the first insulating film may be executed, and then the second polishing step of selectively polishing the first insulating film under second polishing conditions may be executed.

It is preferable that the conditions under which a polishing speed of the first insulating film is quicker than a polishing speed of the plug conductive film is employed as the second polishing conditions.

Then, in order to obtain such polishing speed, the slurry that is different from the slurry employed under the first polishing conditions may be employed as the slurry employed under the second polishing conditions.

DESCRIPTION OF THE PREFERRED EMBODIMENT

An embodiment of the present invention will be explained with reference to the drawings hereinafter.

Figure 2A:
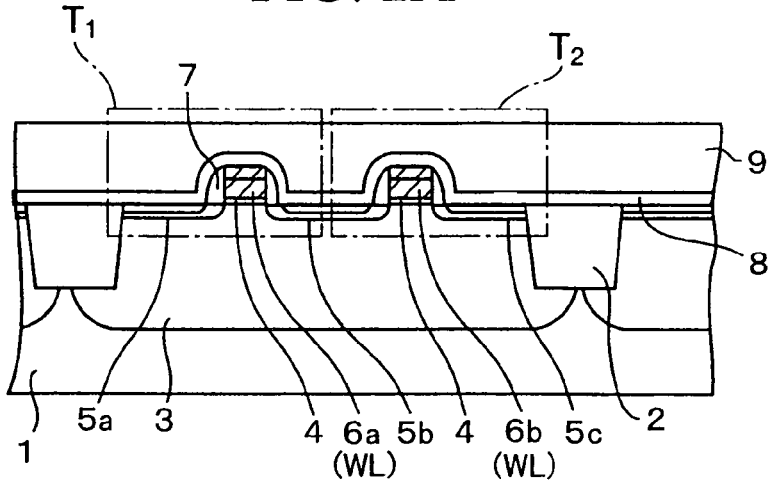
FIGS. 2A to 2S are sectional views showing a semiconductor device manufacturing method according to an embodiment of the present invention.
Figure 2B:
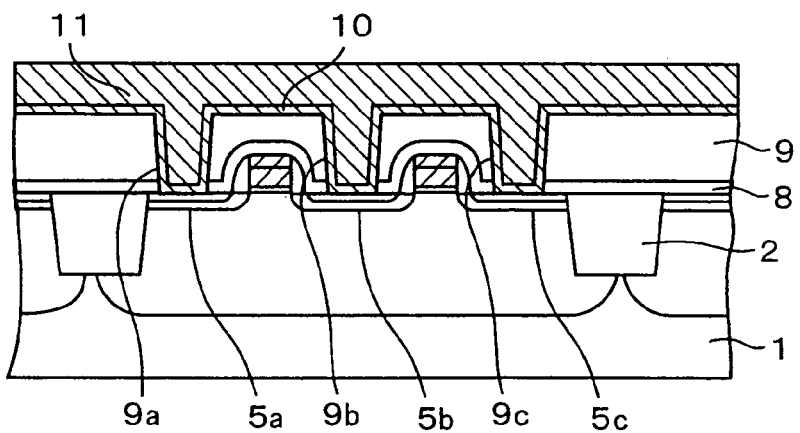
Figure 2C:
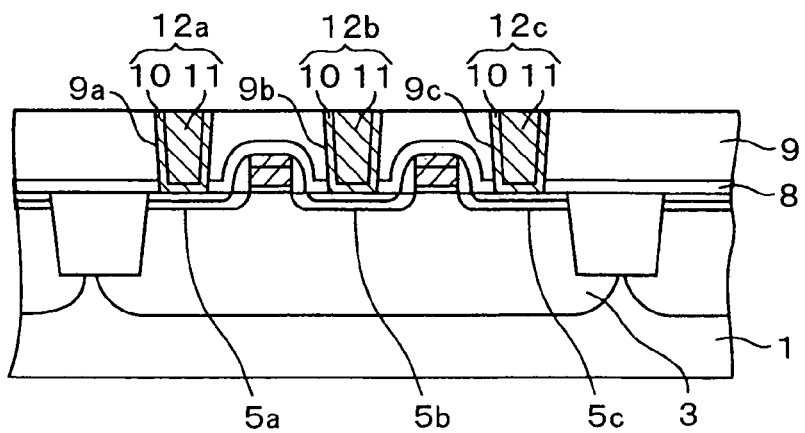
Figure 2D:
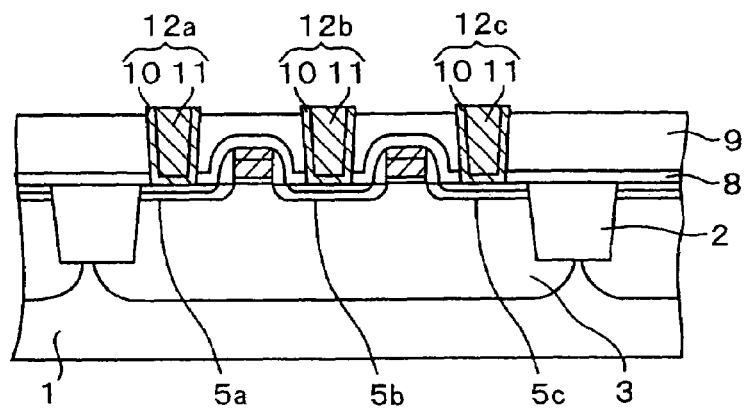
Figure 2E:
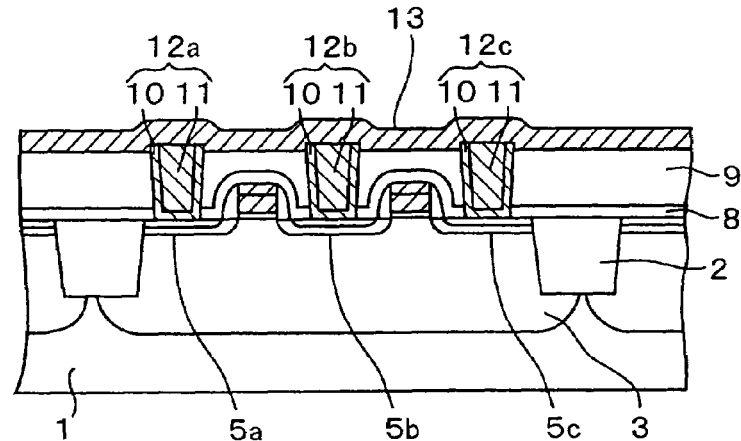
Figure 2F:
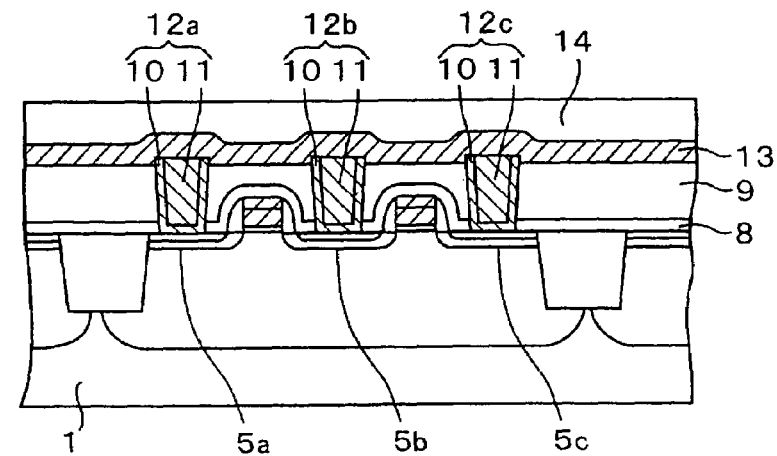
Figure 2G:
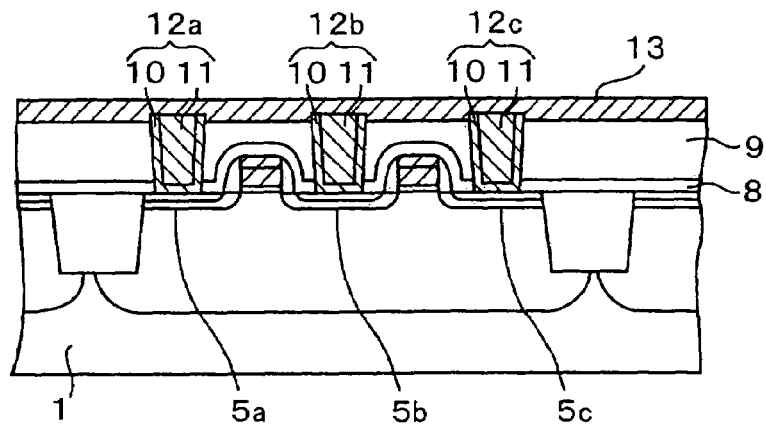
Figure 2H:
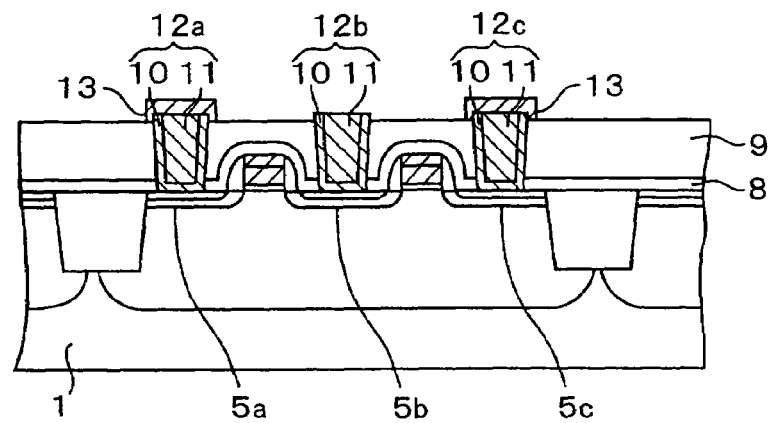
Figure 2I:
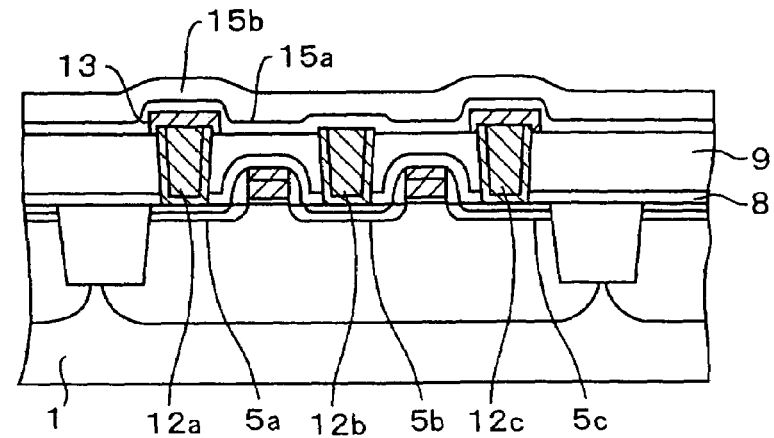
Figure 2J:
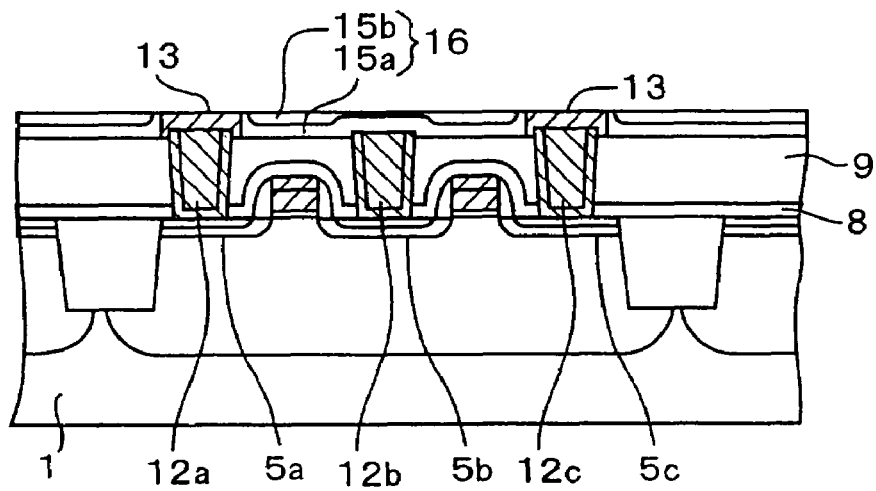
Figure 2K:
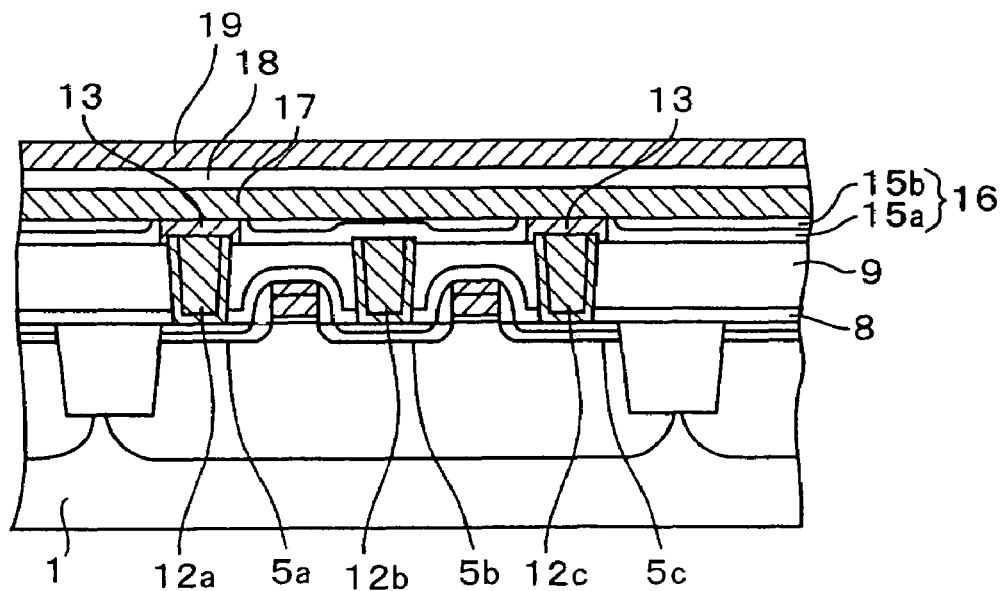
Figure 2L:
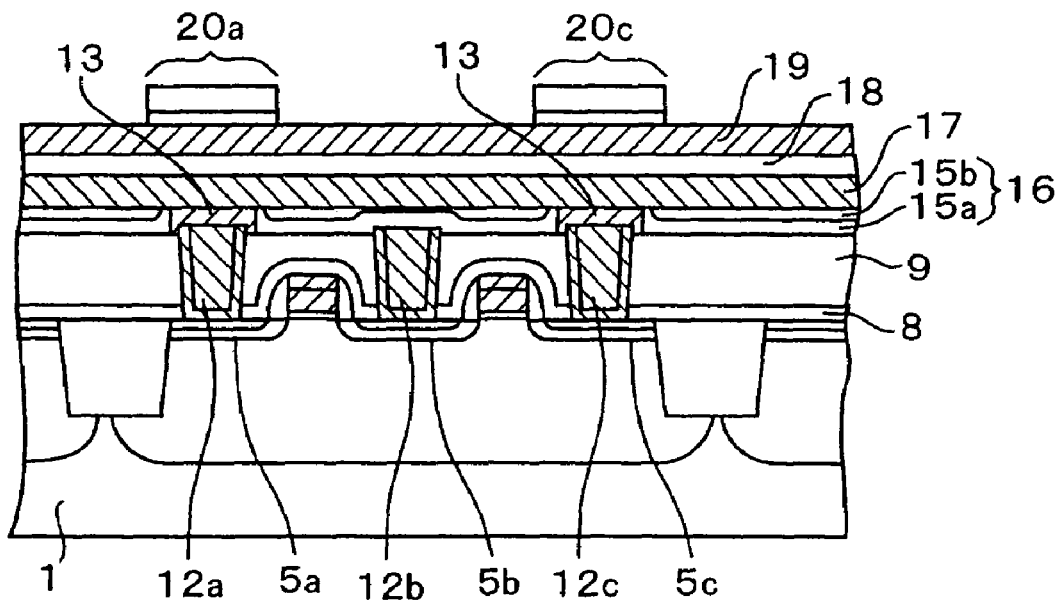
Figure 2M:
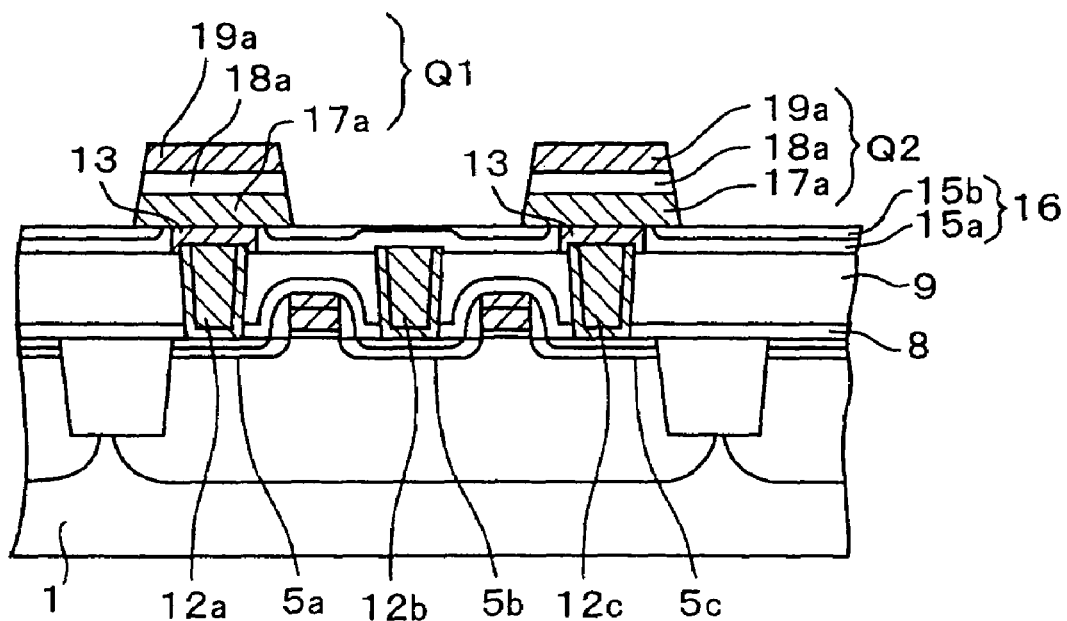
Figure 2N:
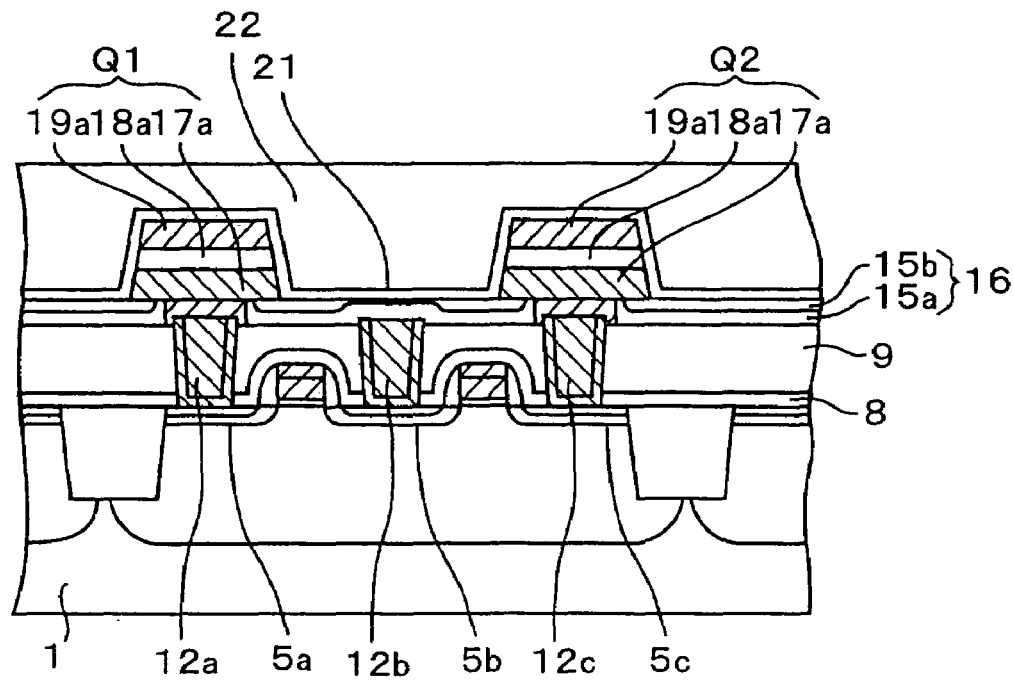
Figure 2O:
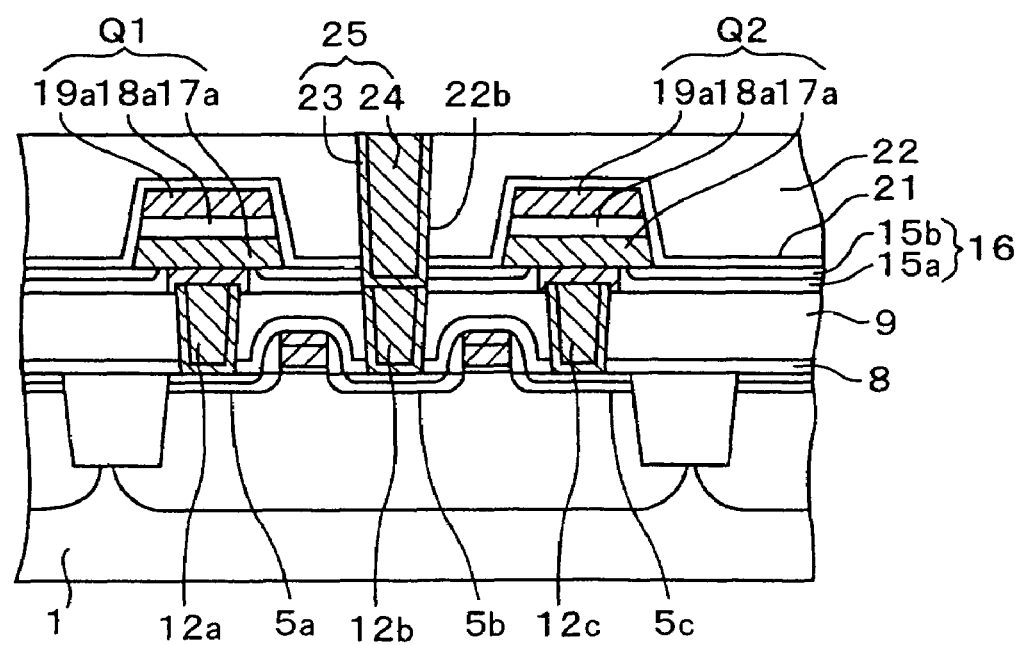
Figure 2P:
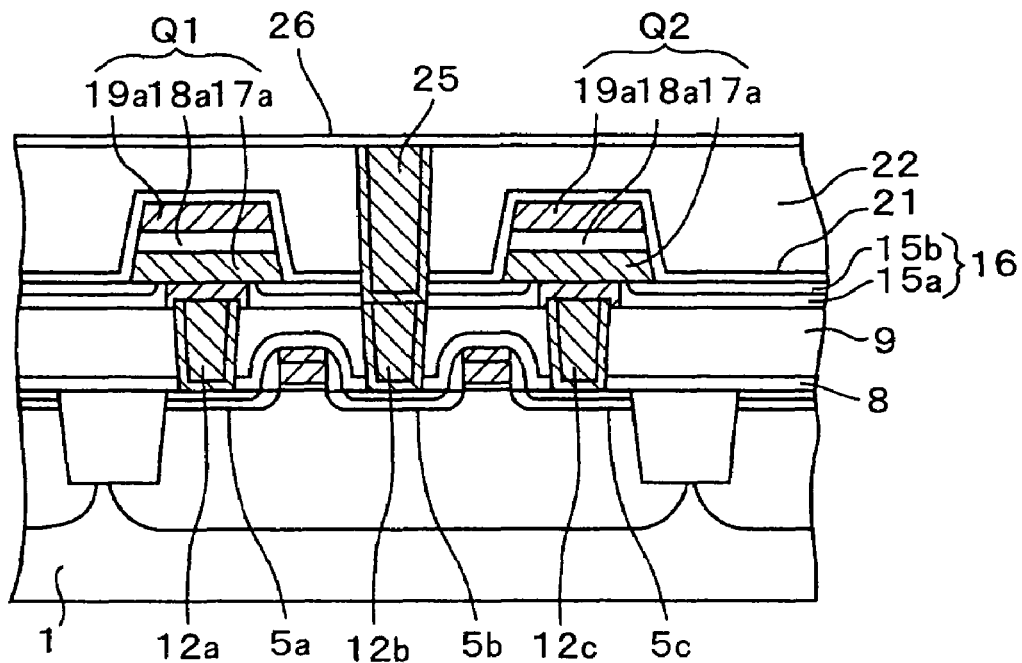
Figure 2Q:
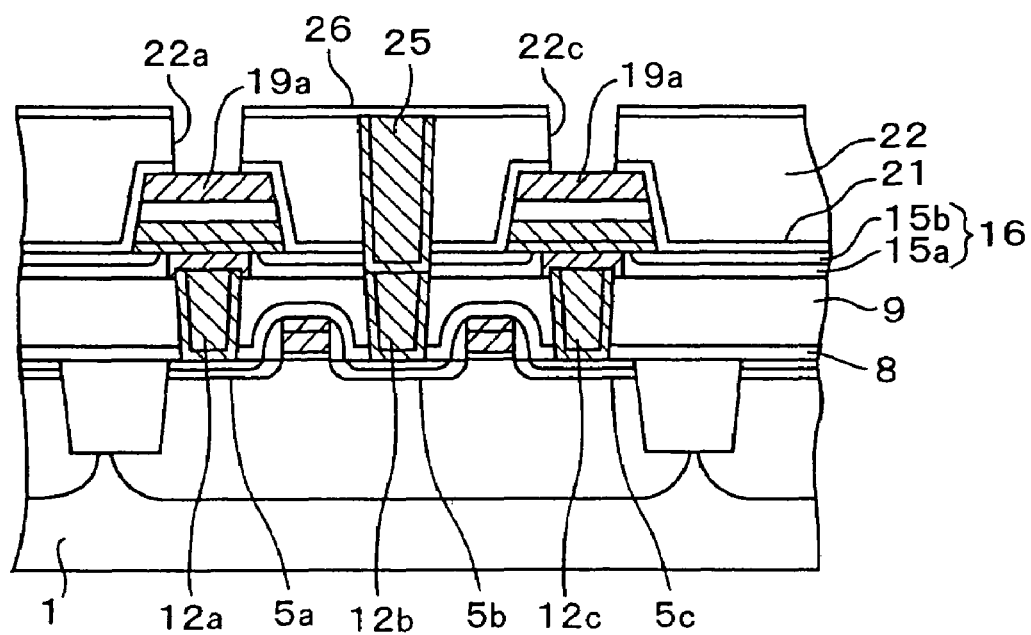
Figure 2R:
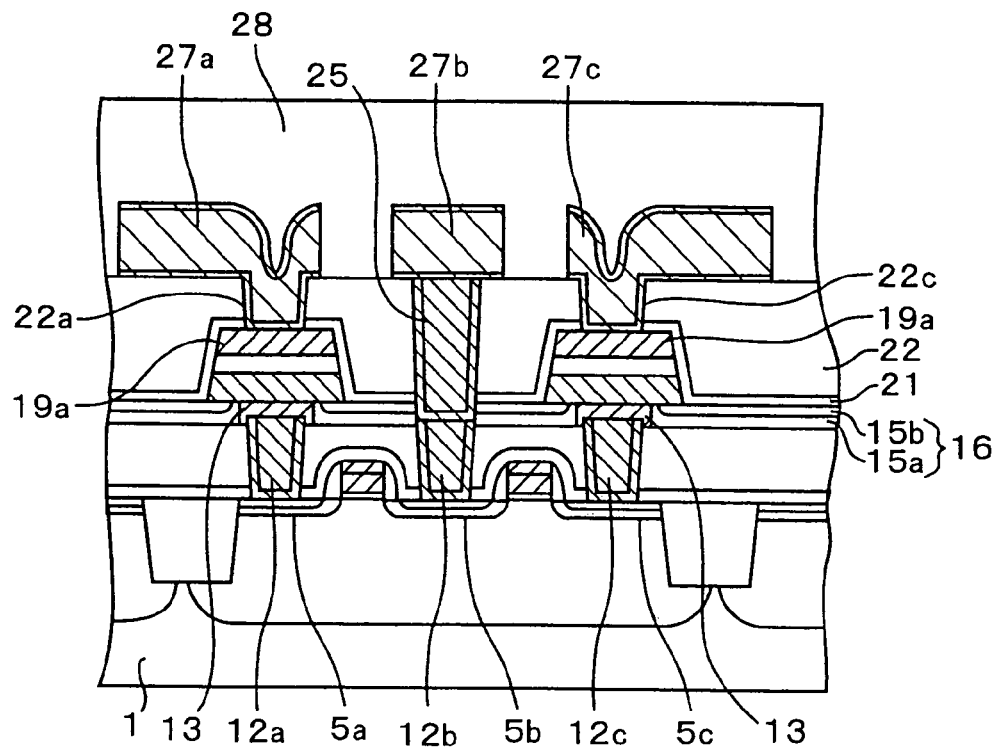
Figure 2S:
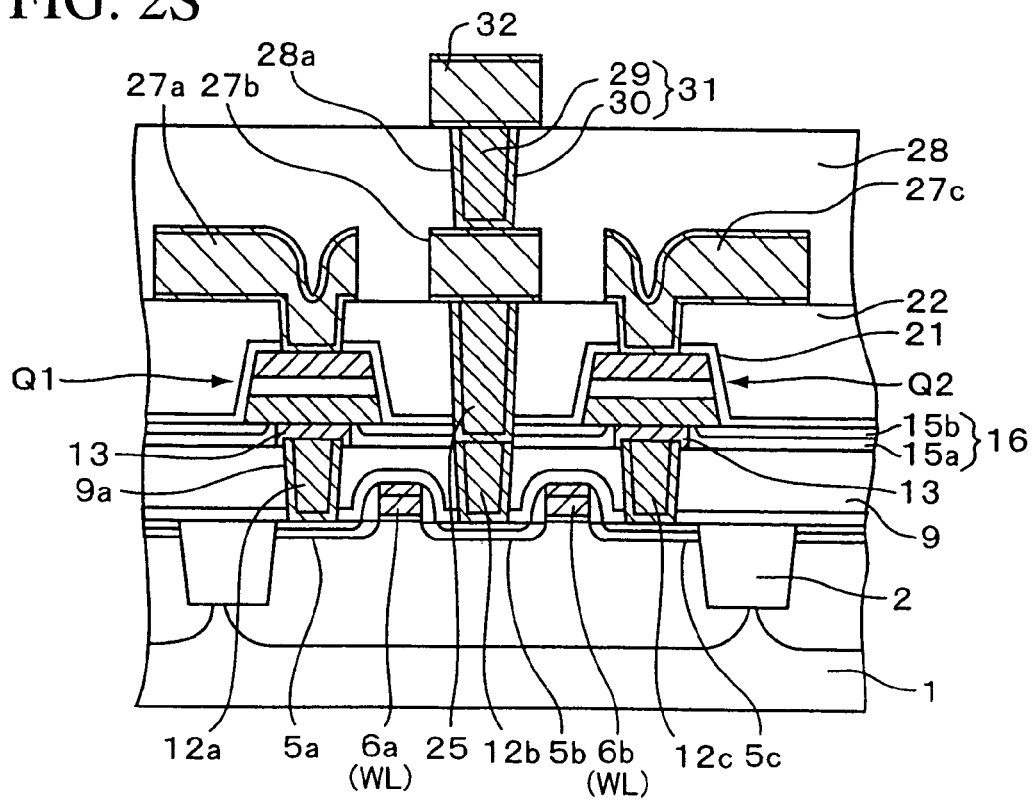

FIGS. 2A to 2S are sectional views showing a semiconductor device manufacturing method according to an embodiment of the present invention.

First, steps required until a sectional structure shown in FIG. 2A is formed will be explained hereunder.

As shown in FIG. 2A, a device isolation recess is formed around a transistor forming region of an n-type or p-type silicon (semiconductor) substrate 1 by the photolithography method, and then a device isolation insulating film 2 is formed by burying the silicon oxide ($SiO_2$) in the recess. The device isolation insulating film 2 having such structure is called STI (Shallow Trench Isolation). In this case, the insulating film formed by the LOCOS (Local Oxidation of Silicon) method may be employed as the device isolation insulating film.

Then, a p-well 3 is formed by introducing selectively the p-type impurity into a predetermined transistor forming region of the silicon substrate 1. Then, a silicon oxide film is formed as a gate insulating film 4 by thermally oxidizing a surface of the p-well 3 of the silicon substrate 1.

Then, an amorphous silicon or polysilicon film and a tungsten silicide film are formed sequentially on the overall upper surface of the silicon substrate 1. Then, gate electrodes 6a, 6b are left on the gate insulating film 4 by patterning the silicon film and the tungsten silicide film by means of the photolithography method. In this case, these gate electrodes 6a, 6b constitute a part of the word line (WL).

Then, first to third n-type impurity diffusion regions 5a to 5c serving as the source/drain are formed by ion-implanting the n-type impurity, e.g., phosphorus, into the p-well 3 on both sides of the gate electrodes 6a, 6b. Then, an insulating film, e.g., a silicon oxide ($SiO_2$) film, is formed on the overall surface of the silicon substrate 1 by the CVD method. Then, insulating sidewall spacers 7 are left on both side portions of the gate electrodes 6a, 6b by etching back the insulating film.

Then, the n-type impurity is ion-implanted once again into the first to third n-type impurity diffusion regions 5a to 5c by using the gate electrodes 6a, 6b and the sidewall spacers 7 as a mask. As a result, high-concentration impurity regions are formed in the first to third n-type impurity diffusion regions 5a to 5c respectively, whereby the first to third n-type impurity diffusion regions 5a to 5c have the LDD (Lightly Doped Drain) structure.

The first and third n-type impurity diffusion regions 5a, 5c out of the above diffusion regions are connected electrically to the lower electrodes of the capacitors described later, while the second n-type impurity diffusion region 5b is connected electrically to the bit line described later.

According to the above steps, two n-type MOS transistor $T_1$, $T_2$ having the gate electrodes 6a, 6b and the n-type impurity diffusion regions 5a to 5c are formed on the p-well 3 to have one n-type impurity diffusion region 5b commonly.

Then, a silicon oxide nitride (SiON) film of about 200 nm thickness is formed as a cover insulating film 8, which covers the MOS transistor $T_1$, $T_2$, on the overall surface of the silicon substrate 1 by the plasma CVD method. Then, a silicon oxide ($SiO_2$) of about 1.0 μm thickness is formed as a first interlayer insulating film (first insulating film) 9 on the cover insulating film 8 by the plasma CVD method using the TEOS gas.

Then, an upper surface of the first interlayer insulating film 9 is planarized by the CMP method. Then, the first interlayer insulating film 9 is annealed in the $N_2$ atmosphere at about 65° C. to execute the degassing sufficiently.

Next, steps required until a structure shown in FIG. 2B is obtained will be explained hereunder.

First, contact holes 9a to 9c having a depth reaching the first to third n-type impurity diffusion regions 5a to 5c are formed by patterning the cover insulating film 8 and the first interlayer insulating film 9 by virtue of the photolithography method.

Then, a titanium (Ti) film of about 20 nm thickness and a titanium nitride (TiN) film of about 50 nm thickness are formed sequentially in this order on an upper surface of the first interlayer insulating film 9 and inner surfaces of the contact holes 9a to 9c as a glue film 10 by the sputter method. Then, a tungsten (W) film (plug forming conductive film) 11 is grown on the glue film 10 by the CVD method using tungsten hexafluoride ($WF_6$) to bury insides of respective contact holes 9a to 9c perfectly.

Then, as shown in FIG. 2C, the tungsten film 11 and the glue film 10 are polished selectively by the CMP method while using the first interlayer insulating film 9 as a polishing stopper film to remove from an upper surface of the first interlayer insulating film 9. This step is called the first polishing step hereinafter.

As the polishing condition of the first polishing step, such a condition is employed that a polishing speed of the tungsten film 11 can be set more quickly than a polishing speed of the first interlayer insulating film 9. Such polishing can be implemented by using the slurry that can make the polishing speed of the tungsten film 11 quicker than the polishing speed of the first interlayer insulating film 9. As the slurry for such tungsten CMP (W-CMP), there is SSW2000 (product name) manufactured by Cabot Microelectronics Corporation, for example. According to this SSW2000, since the polishing speed of the tungsten is about 300 nm/min and the polishing speed of the silicon oxide is about 12 nm/min, a selective polishing ratio (=polishing speed of the tungsten: polishing speed of the silicon oxide) becomes almost 25:1.

Then, according to this first polishing step, the tungsten film 11 and the glue film 10 are left in the contact holes 9a to 9c as first conductive plugs 12a, 12c and a second conductive plug 12b. These conductive plugs are connected electrically to the first to third n-type impurity diffusion regions 5a to 5c respectively.

Then, as shown in FIG. 2D, while using continuously the CMP equipment used in the first polishing step, the first interlayer insulating film 9 is polished by the CMP method under the polishing condition such that the polishing speed of the first interlayer insulating film 9 can be set quicker than the polishing speed of the tungsten film 11. Due to difference of the polishing speeds, the first interlayer insulating film 9 is polished selectively and its upper surface is scraped, while respective conductive plugs 12a to 12c are seldom polished. Therefore, upper end portions of respective conductive plugs 12a to 12c are projected from the upper surface of the first interlayer insulating film 9. This step is called the second polishing step hereinafter.

In this second polishing step, SS25 (product name) manufactured by Cabot Microelectronics Corporation for example, is employed as the slurry. According to this SS25, since the polishing speed of the silicon oxide is about 330 nm/min and the polishing speed of the tungsten is about 9 nm/min, a selective polishing ratio (=polishing speed of the tungsten: polishing speed of the silicon oxide) becomes almost 0.03:1.

Then, the substrate temperature is set to about 350° C. and then the first interlayer insulating film 9 is exposed to the $N_2$ plasma for about 120 second.

Then, as shown in FIG. 2E, an iridium (Ir) film having the excellent oxygen-transmission preventing ability is formed as a conductive oxygen barrier film 13 on the conductive plugs 12a to 12c and the first interlayer insulating film 9 by the sputter method to have a thickness of about 200 nm. As such conductive oxygen barrier film 13, a film made of platinum-group metal such as ruthenium (Ru), or the like may be employed in addition to the Ir film.

Then, as shown in FIG. 2F, a PZT film is formed as a sacrifice film 14 by the sol-gel method. In this sol-gel method, first a PZT $((Pb(Zr_{1-x}Ti_x))O_3)$ solution of 10 wt % is prepared by dissolving lead acetate trihydate $(Pb(OAc)_2 3H_2O)$, zircon tetranubtoxide $(Zr(O-n-Bu)_4)$, and titanium tetraisopropoxide $(Ti(O-j-Pr)_4)$ into 2-methoxyethanol $(CH_3OC_2H_4OH)$. Then, the silicon substrate 1 is loaded into the spin coater (not shown), and then a PZT coating film of about 70 nm thickness is formed by spin-coating the above PZT solution on the conductive oxygen barrier film 13.

Then, the solvent component in the above PZT coating film is dried by executing the temporal baking at the substrate temperature of about 360° C. for about two minute. Then, a total film thickness of laminated films of the PZT coating film is set to about 200 nm by repeating twice further the formation of the PZT coating film and the temporal baking in the same manner as above. In this case, a thickness of the PZT coating film at the second time is about 70 nm, and a thickness of the PZT coating film at the third time is about 60 nm. Then, the laminated films of such PZT coating film are used as the sacrifice film 14.

Since the sacrifice film 14 is formed by the above spin coating, the sacrifice film 14 absorbs unevenness of the underlying conductive oxygen barrier film 13 and thus an upper surface of the sacrifice film 14 is made substantially flat.

In this case, although formation of the sacrifice film 14 is executed separately at plural times in the above, such sacrifice film 14 may formed at a time. However, since a thickness of the sacrifice film 14 is relatively thick such as about 200 nm, it is possible that, when such sacrifice film 14 is formed at a time by the spin coating, a distribution of the film thickness becomes worse. In contrast, when formation of the sacrifice film 14 is carried out separately at plural times as above, a film thickness at each time can be formed thin and thus a distribution of the film thickness at each time does not become worse. As a result, a distribution of the film thickness of the sacrifice film 14 does not become worse.

Also, other PZT material such as PLCSZT, PLZT, or the like may be used as the sacrifice film 14 in place of the above PZT film.

Next, steps required until a structure shown in FIG. 2G is obtained will be explained hereunder.

First, the silicon substrate 1 is loaded on the lower electrode in the etching chamber (not shown), and then the substrate temperature is set to about 25° C. Then, a pressure of the inside of the chamber is held at about 0.5 Pa by introducing chlorine $(Cl_2)$ and argon (Ar) at flow rate ratios of 10:40 (=$Cl_2$:Ar) into the chamber while exhausting the gas in the chamber by the pump (not shown). Then, the plasma is generated between the upper and lower electrodes by applying a low-frequency power of a frequency 460 kHz and a power 1000 W to the lower electrode and also applying a high-frequency power of a frequency 13.56 MHz and a power 1400 W to the upper electrode that opposes to the lower electrode. Accordingly, the interior of the etching chamber is set to such an etching atmosphere that the selective etching ratio of the sacrifice film 14 and the conductive oxygen barrier film 13 becomes almost 1:1.

Then, the etching-back is applied from the upper surface of the sacrifice film 14 by holding the above condition for about 30 second. In this etching-back, since the selective etching ratio of the sacrifice film 14 and the conductive oxygen barrier film 13 is almost 1:1, a shape of the etched surface is never changed when the etching proceeds from the etching of the sacrifice film 14 to the etching of the conductive oxygen barrier film 13. Therefore, a flat upper surface shape of the sacrifice film 14 prior to the etching-back is transferred onto the conductive oxygen barrier film 13, and thus the upper surface of the conductive oxygen barrier film 13 is shaped into the flat shape after the end of the etching-back.

In this case, it may be considered that SOG (Spin on Glass) is employed as the sacrifice film 14. However, since the etching rates of the SOG and the conductive oxygen barrier film 13 are different, the flat upper surface of the sacrifice film 14 cannot be transferred onto the conductive oxygen barrier film 13 by the etching-back, unlike the above. Thus, the employment of the SOG is not preferable.

Next, steps required until a structure shown in FIG. 2H is obtained will be explained hereunder.

First, a resist pattern (not shown) is formed on the upper surface of the planarized conductive oxygen barrier film 13. Then, the silicon substrate 1 is loaded on the lower electrode in the etching chamber used in the step in FIG. 2D, and then the substrate temperature is set to about 250° C. Then, the pressure of the inside of the chamber is held at about 0.5 Pa by introducing Ar, HBr, and $O_2$ at flow rate ratios of 1:0.8 (=HBr:$O_2$) into the chamber while exhausting the gas in the chamber by the pump (not shown). Then, the plasma is generated between the upper and lower electrodes by applying the low-frequency power of the frequency 460 kHz and the power 800 W to the lower electrode and also applying the high-frequency power of the frequency 13.56 MHz and the power 300 W to the upper electrode.

Then, this condition is held for about 160 second, and the conductive oxygen barrier film 13 is etched selectively by using the resist pattern as an etching mask. As a result, the conductive oxygen barrier film 13 is patterned to cover end portions of the first conductive plugs 12a, 12c.

In this manner, since the end portions of the first conductive plugs 12a, 12c are covered with the conductive oxygen barrier film 13, the oxygen is difficult to enter into the first conductive plugs 12a, 12c. Therefore, oxidation of the first conductive plugs 12a, 12c by various annealing steps, described later, can be prevented.

In addition, since the conductive oxygen barrier film 13 is formed to wrap the end portions of the first conductive plugs 12a, 12c therein, contact areas between the conductive oxygen barrier film 13 and the first conductive plugs 12a, 12c can be widened, so that their contact characteristics can be improved.

Figure 1A:
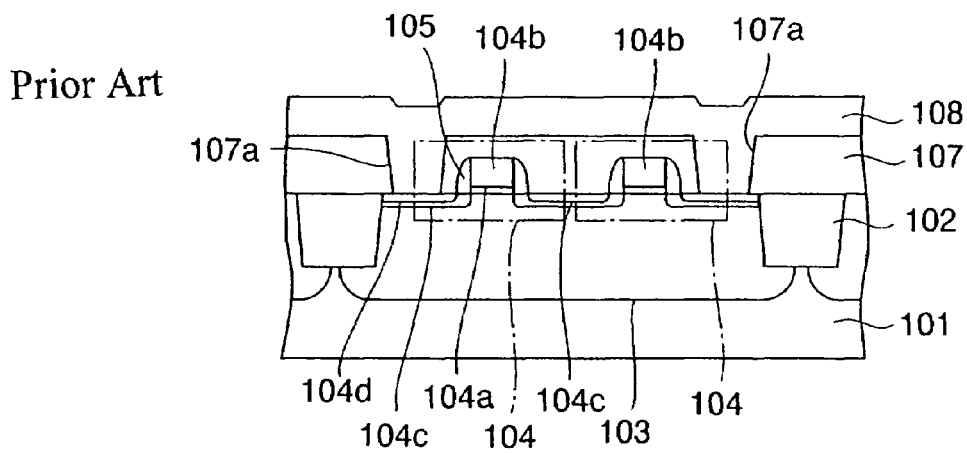
FIGS. 1A to 1C are sectional views showing a semiconductor device manufacturing method in the prior art.
Figure 1B:
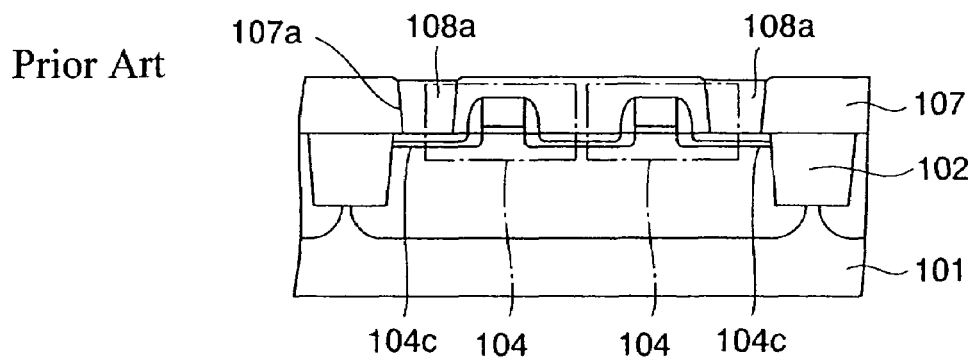
Figure 1C:
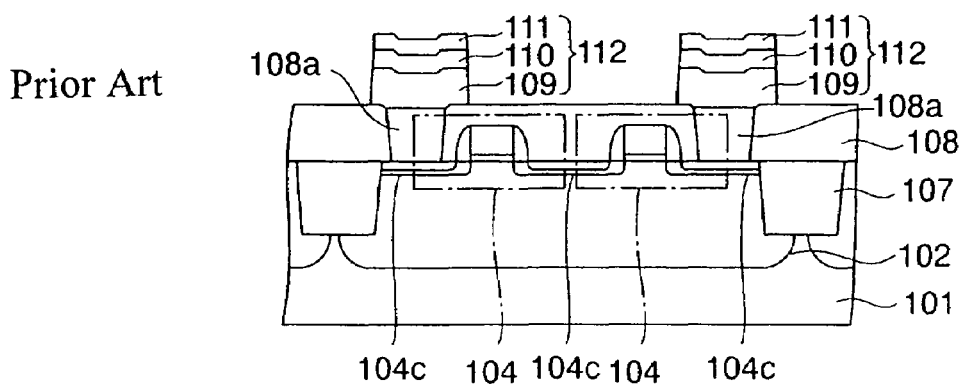
Figure 3:
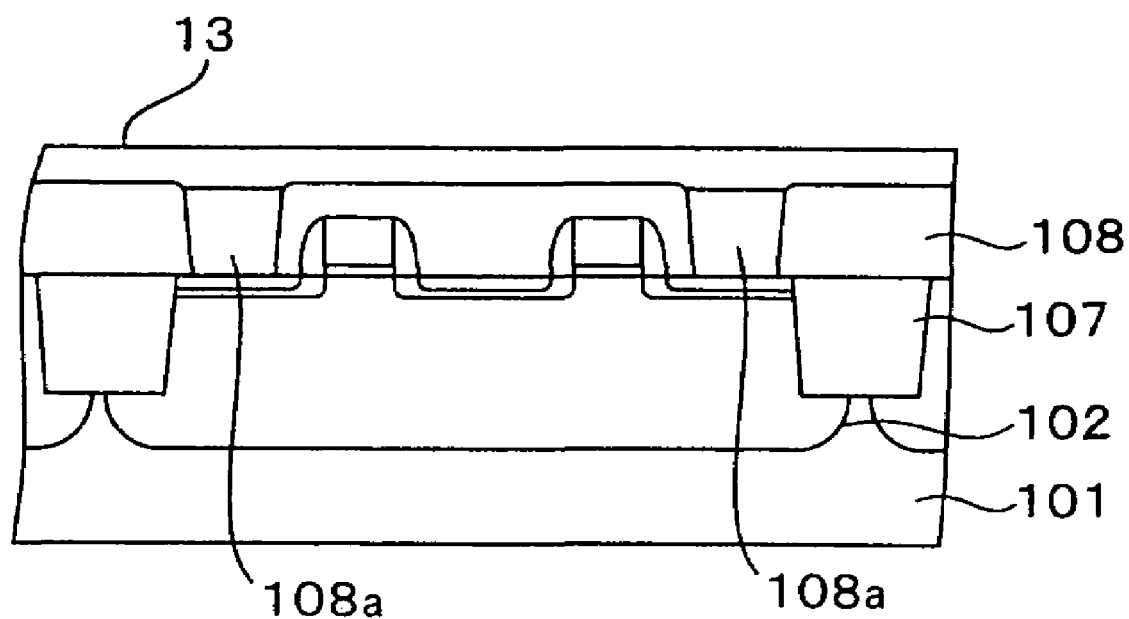
FIG. 3 is a sectional view showing a semiconductor device manufacturing method according to a comparative example.

In this case, in order to prevent merely the oxidation of the conductive plugs, it may be considered that, as shown in FIG. 3, the conductive oxygen barrier film 13 made of Ir is formed on the contact plugs 108a and the interlayer insulating film 108 after the step in FIG. 1B in the prior art. However, according to this method, the crystal of Ir is ready to crack along the recess shapes around the contact plugs 108a, and thus there is such a possibility that the contact characteristic becomes worse.

In contrast, like the present embodiment, when the conductive oxygen barrier film 13 is formed in the situation that the end portions of the first conductive plugs 12a, 12c are protruded, the above crack of the crystal is not caused and also the contact characteristic does not become worse.

Then, as shown in FIG. 2I, a silicon oxide nitride (SiON) film or a silicon nitride ($Si_3N_4$) film of 100 nm thickness, for example, is formed as an oxidation-preventing insulating film 15a on the conductive oxygen barrier film 13 and the first interlayer insulating film 9 by the CVD method. Then, a silicon oxide ($SiO_2$) layer of 300 nm thickness, for example, is formed as an insulating adhesion film 15b on the oxidation-preventing insulating film 15a by the CVD method using TEOS.

Then, as shown in FIG. 2J, the insulating adhesion film 15b and the oxidation-preventing insulating film 15a are polished by the CMP using the conductive oxygen barrier film 13 as a polishing stopper. Thus, these films are shaped into an insulating oxygen barrier film 16 having a double-layered structure and also an upper surface of the conductive oxygen barrier film 13 is exposed.

At this time, since the conductive oxygen barrier film 13 has already been patterned and is isolated electrically on respective first conductive plugs 12a, 12c, there is no need to execute this CMP like the slight over-etching, unlike the prior art. As a result, respective upper surfaces of the conductive oxygen barrier film 13 and the insulating oxygen barrier film 16 can be polished by using the conductive oxygen barrier film 13 as the polishing stopper film.

Also, according to this CMP, for example, when the polishing speed is slowed by adding a pure water into the slurry and then an amount of polishing is controlled by finely adjusting the polishing time, the excessive polishing of the conductive oxygen barrier film 13 can be prevented and also the polished surface can be ready to planarize. As such slurry, SS25 manufactured by CABOT Inc., for example, can be employed.

In addition, since the conductive oxygen barrier film 13 is planarized previously by the etching-back prior to the above CMP, respective upper surfaces of the insulating oxygen barrier film 16 and the conductive oxygen barrier film 13 can be made much more flat.

The resultant insulating oxygen barrier film 16 having the double-layered structure can function to prevent the event that the underlying second conductive plug 12b is oxidized in various annealing steps to be described later.

Then, as shown in FIG. 2K, an Ir film of 200 nm thickness, an $IrO_2$ film of 30 nm thickness, a PtO film of 30 nm thickness, and a Pt film of 50 nm thickness, for example, are formed sequentially as a lower electrode conductive film 17 on the conductive oxygen barrier film 13 and the insulating oxygen barrier film 16.

At this time, because the insulating oxygen barrier film 16 is formed as the double-layered structure and also the lower electrode conductive film 17 is formed on the insulating adhesion film 15b, the lower electrode conductive film 17 can be prevented from peeling off from the insulating oxygen barrier film 16.

Also, since the lower electrode conductive film 17 is formed on respective planarized upper surfaces of the insulating oxygen barrier film 16 and the conductive oxygen barrier film 13, an upper surface of the lower electrode conductive film 17 is also formed flat.

In this case, the insulating adhesion film 15b is annealed to prevent the peeling-off of the film, for example, before or after the formation of the lower electrode conductive film 17. As the annealing method, RTA (Rapid Thermal Annealing) executed in the argon atmosphere at 750° C. for 60 second, for example, is employed.

Then, a PZT film of 180 nm thickness, for example, is formed as a ferroelectric film 18 on the lower electrode conductive film 17 by the sputter method. As the method of forming the ferroelectric film 18, there may be employed other PZT material such as PLCSZT, PLZT, Bi-layered structure compound material such as $SrBi_2Ta_2O_9$, $SrBi_2(Ta,Nb)_2O_9$, etc., and other metal oxide ferroelectric substance in addition to PZT.

Then, the ferroelectric film 18 is crystallized by executing the annealing in the oxygen-containing atmosphere. As the annealing, two-step RTA process having the first step executed in the mixed gas atmosphere consisting of Ar and $O_2$ at the substrate temperature of 600° C. for 90 second and the second step executed in the oxygen atmosphere at the substrate temperature of 750° C. for 60 second, for example, is employed.

At this time, since the upper surface of the lower electrode conductive film 17 is a flat shape, such lower electrode conductive film 17 never has a bad influence upon the crystallization of the overlying ferroelectric film 18 and also never causes the deterioration of the polarization characteristic.

Then, a IrO$_2$ layer of 200 nm thickness, for example, is formed as an upper electrode conductive film 19 on the ferroelectric film 18 by the sputter method.

Next, steps required until a structure shown in FIG. 2L is obtained will be explained hereunder.

First, a TiN film and an SiO$_2$ film are formed sequentially on the upper electrode conductive film 19. The TiN film is formed by the sputter method, and the SiO$_2$ film is formed by the CVD method using TEOS. Then, these laminated films are patterned by the photolithography method. Thus, hard masks 20a, 20b that are patterned into the planar shape of the capacitor are formed over the first conductive plugs 12a, 12c.

Then, the upper electrode conductive film 19, the ferroelectric film 18, and the lower electrode conductive film 17 are etched sequentially in the region that is not covered with the hard masks 20a, 20b. In this case, the ferroelectric film 18 is etched by the sputter reaction in the atmosphere containing the halogen element. Even if the insulating adhesion film 15b is etched by such etching, the oxidation-preventing insulating film 15a can function as the etching stopper, and therefore the second conductive plug 12b is never exposed.

With the above, as shown in FIG. 2M, capacitors $Q_1$, $Q_2$ are formed on the first interlayer insulating film 9. Lower electrodes 17a of the capacitors $Q_1$, $Q_2$ are made of the lower electrode conductive film 17. Also, capacitor ferroelectric films 18a of the capacitors $Q_1$, $Q_2$ are made of the ferroelectric film 18, and also upper electrodes 19a are made of the upper electrode conductive film 19.

The lower electrodes 17a of the capacitors $Q_1$, $Q_2$ are connected electrically to the first and third n-type impurity diffusion regions 5a, 5c via the first conductive plugs 12a, 12c respectively.

In this case, the hard masks 20a, 20b are removed after the capacitors $Q_1$, $Q_2$ are formed.

Then, in order to recover the damage of the ferroelectric film 18 caused by the etching, the recover annealing is carried out. The recover annealing in this case is carried out at the substrate temperature of 650° C. for 60 second in the furnace containing the oxygen, for example.

In this manner, when the annealing process such as the recover annealing, or the like is applied immediately after the patterning of the ferroelectric film 18, the thermal resistance of the first conductive plugs 12a, 12c formed immediately under the lower electrodes 17a is decided by the oxygen permeability of the conductive oxygen barrier film 13 whereas the oxidation resistance of the second conductive plug 12b that is not positioned immediately under the lower electrode 17a is decided by the oxygen permeability of the insulating oxygen barrier film 16.

Above-mentioned thermal processes are required to form the capacitors $Q_1$, $Q_2$. In the case that the silicon nitride film is employed as the oxidation-preventing insulating film 15a, the tungsten of the second conductive plug 12b is not abnormally oxidized if a thickness of the silicon nitride film is in excess of 70 nm.

Also, when a total film thickness of the conductive oxygen barrier film 13 made of the Ir film and the Ir film as the lowermost layer of the lower electrode 17a is 400 nm, the tungsten in the first conductive plugs 12a, 12c is never abnormally oxidized by the oxygen annealing. In the present embodiment, since the total film thickness of the above Ir films exceeds about 400 nm, the first conductive plugs 12a, 12c are not abnormally oxidized.

Also, when the total film thickness of the above Ir films is increased by about 100 nm correspondingly every time when the temperature of the oxygen annealing is increased by about 100° C., the abnormal oxidization of the first conductive plugs 12a, 12c can be prevented even though the annealing temperature is increased.

Then, as shown in FIG. 2N, an alumina film of 50 nm thickness is formed as a capacitor protection insulating film 21 on the capacitors $Q_1$, $Q_2$ and the insulating oxygen barrier film 16 by the sputter. This capacitor protection insulating film 21 protects the capacitors $Q_1$, $Q_2$ from the process damage, and may be formed of PZT in addition to alumina. Then, the capacitors $Q_1$, $Q_2$ are annealed at 650° C. for 60 second in the oxygen atmosphere in the furnace.

Then, a silicon oxide (SiO$_2$) film of about 1.0 μm thickness is formed as a second interlayer insulating film (second insulating film) 22 on the capacitor protection insulating film 21 by the HDPCVD (High Density Plasma CVD) method.

Then, an upper surface of the second interlayer insulating film 22 is planarized by the CMP method. In this example, a remaining thickness of the second interlayer insulating film 22 after CMP is set to about 300 nm on the upper electrode 19a.

Next, steps required until a structure shown in FIG. 2O is obtained will be explained hereunder.

First, a hole 22b is formed on the second conductive plug 10b by etching the second interlayer insulating film 22, the capacitor protection insulating film 21, and the insulating oxygen barrier film 16 while using a resist mask (not shown).

Then, a TiN film of 50 nm thickness is formed as a glue film 23 in the hole 22b and on the second interlayer insulating film 22 by the sputter method. Then, a tungsten (W) film 24 is grown on the glue film 23 by the CVD method using the tungsten hexafluoride to bury an inside of the hole 22b completely.

Then, the tungsten film 24 and the glue film 23 are polished by the CMP method to remove from an upper surface of the second interlayer insulating film 22. Then, the tungsten film 24 and the glue film 23 left in the hole 22b are used as a third conductive plug 25.

As a result, the third conductive plug 25 is connected to the second conductive plug 12b to constitute the via-to-via contact and thus is connected electrically to the second n-type impurity diffusion region 5b.

Then, the second interlayer insulating film 22 is annealed at 350° C. for 120 second in the nitrogen plasma atmosphere.

Then, as shown in FIG. 2P, a SiON layer of 100 nm thickness is formed as an oxidation-preventing insulating film 26 on the third conductive plug 25 and the second interlayer insulating film 22 by the CVD method.

Then, as shown in FIG. 2Q, holes 22a, 22c are formed on the upper electrodes 19a of the capacitors $Q_1$, $Q_2$ respectively by patterning the oxidation-preventing insulating film 26, the second interlayer insulating film 22, and the capacitor protection insulating film 21 by virtue of the photolithography method. The capacitors $Q_1$, $Q_2$ that are subjected to the damage by forming the holes 22a, 22c are recovered by the annealing. Such annealing is carried out at the substrate temperature of 550° C. for 60 second in the oxygen-containing atmosphere, for example.

Next, steps required until a structure shown in FIG. 2R is formed will be explained hereunder.

First, the oxidation-preventing insulating film 26 formed on the second interlayer insulating film 22 is removed by the etching-back. Thus, a surface of the third conductive plug 25 is exposed.

Then, a multi-layered metal film is formed in the holes 22a, 22c, which are formed on the upper electrodes 19a of the capacitors $Q_1$, $Q_2$ respectively, and on the second interlayer insulating film 22. As such multi-layered metal film, a Ti film of 60 nm thickness, a TiN film of 30 nm thickness, an Al—Cu film of 400 nm thickness, a Ti film of 5 nm thickness, and a TiN film of 70 nm thickness, for example, are formed sequentially by the sputter method.

Then, a conductive contact pad 27b, which is connected to the third conductive plug 25, and first-layer metal wiring 27a, 27c, which are connected electrically to the upper electrodes 19a of the capacitors $Q_1$, $Q_2$ via the holes 22a, 22c respectively, are formed by patterning this multi-layered metal film.

In this case, in order to prevent reduction in the pattern precision due to the reflection of the exposure light when the multi-layered metal film is patterned, a method of forming a reflection-preventing layer (not shown) such as silicon oxide nitride (SiON), or the like on the multi-layered metal film to have a thickness of 30 nm, then coating a resist on the reflection-preventing layer, then forming resist patterns of wiring shapes, etc. by exposing/developing the resist, and then etching the multi-layered metal film by using such resist patterns is employed. This reflection-preventing layer may be left as it is after the multi-layered metal film is patterned.

Then, a third interlayer insulating film 28 is formed on the second interlayer insulating film 22, the first-layer metal wiring 27a, 27c, and the conductive contact pad 27b.

Next, steps required until a structure shown in FIG. 2S is obtained will be explained hereunder.

First, a bit-line contact hole 28a is formed on the conductive contact pad 27b by patterning the third interlayer insulating film 28. Also, a fourth conductive plug 31, which consists of a TiN film 30 and a W film 29 in sequence from the bottom, is formed in the contact hole 28a.

Then, a second-layer metal wiring 32 containing the bit line (BL) is formed on the third interlayer insulating film 28. The second-layer metal wiring 32 has the same multi-layered metal structure as the first-layer metal wiring 27a, 27c. Also, the second-layer metal wiring 32, when connected to the fourth conductive plug 31, is connected electrically to the second n-type impurity diffusion region 5b via the underlying conductive contact pad 27b, the third conductive plug 25, and the second conductive plug 12b.

Then, an insulating film for covering the second-layer metal wiring 32, etc. are formed. Finally, a cover film having a double-layered structure consisting of a silicon nitride film and a silicon oxide film formed of TEOS is formed, but its details will be omitted herein.

According to the above embodiment, the end portions of the first conductive plugs 12a, 12c formed below the capacitors $Q_1$, $Q_2$ are covered with the conductive oxygen barrier film 13. Therefore, since the oxygen is hard to enter into the first conductive plugs 12a, 12c, the abnormal oxidation of the first conductive plugs 12a, 12c in the annealing step can be prevented.

In addition, since the conductive oxygen barrier film 13 is formed to wrap the end portions of the first conductive plugs 12a, 12c therein, the contact areas between the conductive oxygen barrier film 13 and the first conductive plugs 12a, 12c can be increased. Thus, their contact characteristics can be improved.

Further, since the conductive oxygen barrier film 13 is formed in the situation that the end portions of the first conductive plugs 12a, 12c are projected from the upper surface of the first interlayer insulating film 9, the crack of the crystal of the conductive oxygen barrier film 13 can be prevented.

Moreover, since patterned side surfaces of the conductive oxygen barrier film 13 are covered with the insulating oxygen barrier film 16, the oxygen can be prevented from entering from the side surfaces even if the conductive oxygen barrier film 13 is formed substantially equal in size to the first conductive plugs 12a, 12c. Thus, generation of the abnormal oxidation of the first conductive plugs 12a, 12c can be prevented.

While, the abnormal oxidation of the second conductive plug 12b can be prevented by the insulating oxygen barrier film 16 formed on the second conductive plug 12b.

Because the insulating oxygen barrier film 16 is formed to have the double-layered structure consisting of the oxidation-preventing insulating film 15a and the insulating adhesion film 15b and also the lower electrode conductive film 17 is formed on the insulating adhesion film 15b, the peeling-off of the lower electrode conductive film 17 from the insulating oxygen barrier film 16 can be prevented.

Besides, since respective upper surfaces of the conductive oxygen barrier film 13 and the insulating oxygen barrier film 16 are formed as the continuous flat surface by the CMP, the upper surface of the overlying lower electrode conductive film 17 has also the flat shape. Therefore, since the lower electrode conductive film 17 does not exert a bad influence upon the crystallization of the ferroelectric film 18 formed thereon, it can be prevented that the polarization characteristic of the ferroelectric film 18 is deteriorated.

In addition, according to the above CMP, since the conductive oxygen barrier film 13 has already been patterned and is isolated electrically on the first conductive plugs 12a, 12c, there is no necessity that the CMP should be executed slightly in the over-etching manner, unlike the prior art. As a result, respective upper surfaces of the conductive oxygen barrier film 13 and the insulating oxygen barrier film 16 can be planarized by using the conductive oxygen barrier film 13 as the polishing stopper film.

Then, the sacrifice film 14 is formed on the conductive oxygen barrier film 13 before the above CMP, and then the conductive oxygen barrier film 13 is planarized previously by etching back them. Therefore, respective upper surfaces of the insulating oxygen barrier film 16 and the conductive oxygen barrier film 13 can be made much more flat after the CMP.

Then, when the sacrifice film 14 is formed by the spin coating, such sacrifice film 14 can absorb unevenness of the underlying conductive oxygen barrier film 13, so that it is possible to planarize the upper surface of the sacrifice film 14 more easily. Therefore, the upper surface of the conductive oxygen barrier film 13 after the etching-back can be planarized more easily.

In addition, since formation of the sacrifice film 14 is executed separately at plural times by the spin coating, the film thickness at each time can be formed thin and thus a distribution of the film thickness at each time does not become worse. Therefore, it can be prevented that the final distribution of the film thickness of the sacrifice film 14 becomes worse.

Then, when the film whose selective etching ratio to the conductive oxygen barrier film 13 is about 1:1 is employed as the sacrifice film 14, the flat upper surface of the sacrifice film 14 before the etching-back can be transferred onto the conductive oxygen barrier film 13.

Also, the FeRAM has level difference on the first interlayer insulating film 9 by the ferroelectric capacitor rather than the normal logic product. For this reason, when the contact hole that extends from the conductive contact pad 27b to the second n-type impurity diffusion region 5b is formed by one-step etching, an aspect ratio of the contact hole becomes large. Thus, it is difficult to bury the glue film in the contact hole. In order to overcome such difficulty, the latest equipment is needed.

In contrast, in the present embodiment, the via-to-via contact in which two conductive plugs 12b, 25 are connected is formed between the second n-type impurity diffusion region 5b and the conductive contact pad 27b. Therefore, since the above-mentioned difficulty is not caused, yield of the FeRAM product can be improved and also the existing equipment can be still employed. As a result, such an advantage can be achieved that reduction in the development cost and the step cost can be implemented.

With the above, the embodiment of the present invention is explained in detail, but the present invention is not limited to the above embodiment. For example, in the above, the first conductive plugs 12a, 12c and the second conductive plug 12b are formed mainly of the tungsten. Even though these conductive plugs are formed of polysilicon, the similar advantages as the above embodiment can be achieved. Also, in the above, the ferroelectric material is employed as the capacitor dielectric film. The high-dielectric material may be employed in place of such ferroelectric material.

As described above, according to the present invention, since the end portion of the first conductive plug is covered with the conductive oxygen barrier film, the first conductive plugs can be prevented from being abnormally oxidized during various annealing steps.

In addition, since the conductive oxygen barrier film is formed so as to wrap the end portion of the first conductive plug therein, the contact characteristic between the first conductive plugs and the conductive oxygen barrier film can be improved.

Further, in the case where the second conductive plug is formed in addition to the first conductive plug, the abnormal oxidation of the second conductive plug can be prevented by forming the insulating oxygen barrier film that cover the side surface of the end portions of the first conductive plugs.

Then, in the case where the insulating oxygen barrier film is formed in such manner, the abnormal oxidation of the first conductive plug can be prevented by covering the side surfaces of the conductive oxygen barrier film with the side surface of the insulating oxygen barrier film even if the conductive oxygen barrier film is formed substantially equal in size to the first conductive plug.

Also, when the insulating oxygen barrier film is formed of the laminated film consisting of a plurality of films and also the insulating adhesion film is formed as the film of the uppermost layer, the peeling-off of the lower electrodes from the insulating oxygen barrier film can be prevented.

Moreover, according to the present invention, each upper surface of the conductive oxygen barrier film and the insulating oxygen barrier film are formed as the continuous flat surface by the CMP, and the capacitor lower electrode conductive film is formed on the flat surfaces. Therefore, the capacitor lower electrode conductive film does not exert the bad influence upon the crystallization of the ferroelectric film formed thereon, deterioration of the polarization characteristic of the ferroelectric film can be prevented.

In addition, since the conductive oxygen barrier film is formed in the situation that the end portion of the first conductive plug is projected from the upper surface of the first interlayer insulating film, the crack of the crystal of the conductive oxygen barrier film can be prevented.

Further, when the insulating oxygen barrier film is to be polished, the conductive oxygen barrier film has already been patterned and is electrically isolated on each first conductive plug. Therefore, each upper surface of the conductive oxygen barrier film and the insulating oxygen barrier film can be planarized by using the conductive oxygen barrier film as the polishing stopper film.

Furthermore, since the conductive oxygen barrier film is planarized by the etching-back before patterning of the conductive oxygen barrier film is carried out, each upper surface of the insulating oxygen barrier film and the conductive oxygen barrier film can be planarized much more.

Then, since the sacrifice film used in the etching-back is formed by the spin coating, the upper surface of the sacrifice film can be planarized more easily. Therefore, the upper surface of the conductive oxygen barrier film after the etching-back can be planarized more easily.

In addition, since formation of the sacrifice film is executed separately at plural times by the spin coating, the film thickness obtained at each time can be formed thin. Therefore, worsening of the distribution of the film thickness at each time can be prevented, and also worsening of the final distribution of the film thickness of the sacrifice film can be prevented.

Then, since the film whose selective etching ratio to the conductive oxygen barrier film is about 1:1 is employed as the sacrifice film, the flat upper surface of the sacrifice film prior to the etching-back can be transferred onto the conductive oxygen barrier film.

What is claimed is:

1. A manufacturing method of a semiconductor device comprising the steps of:

forming a first impurity diffusion region in a surface layer of a semiconductor substrate;

forming a first insulating film over the semiconductor substrate;

forming a first hole over the first impurity diffusion region by patterning the first insulating film;

forming a first conductive plug, which is electrically connected to the first impurity diffusion region and an upper end portion of which is protruded upward from an upper surface of the first insulating film, in the first hole;

forming a conductive oxygen barrier film on the first conductive plug and the first insulating film;

patterning the conductive oxygen barrier film to leave the conductive oxygen barrier film to cover the upper end portion of the first conductive plug;

forming an insulating oxygen barrier film on the first insulating film and the conductive oxygen barrier film;

polishing the insulating oxygen barrier film to expose a surface of the conductive oxygen barrier film such that each upper surface of the conductive oxygen barrier film and the insulating oxygen barrier film constitute a continuous flat surface;

forming a capacitor lower electrode conductive film on the flat surface;

forming a ferroelectric film on the capacitor lower electrode conductive film;

forming a capacitor upper electrode conductive film on the ferroelectric film; and forming a capacitor, which is constructed by laminating sequentially a capacitor lower electrode, a capacitor dielectric film, and a capacitor upper electrode, by patterning the capacitor upper electrode conductive film, the ferroelectric film, and the capacitor lower electrode conductive film.

2. A method according to claim 1, wherein:

the step of forming a first impurity diffusion region has the step of forming a second impurity diffusion region in the surface layer of the semiconductor substrate, a second hole is formed in the first insulating film over the second impurity diffusion region in the step of forming the first hole, a second conductive plug that is electrically connected to the second impurity diffusion region is formed in the second hole in the step of forming the first conductive plug, and the insulating oxygen barrier film is also formed on the second conductive plug in the step of forming the insulating oxygen barrier film.

3. A method according to claim 1, wherein the step of forming the first conductive plug includes, a step of forming a plug conductive film in the first hole and on the first insulating film, a first polishing step of selectively polishing the plug conductive film under first polishing conditions to remove the plug conductive film from an upper surface of the first insulating film, and a second polishing step of selectively polishing the first insulating film under second polishing conditions after the first polishing step.

4. A method according to claim 3, wherein conditions under which a polishing speed of the first insulating film becomes quicker than a polishing speed of the plug conductive film are employed as the second polishing conditions.

5. A method according to claim 4, wherein slurry used in the first polishing conditions and the second polishing conditions is changed.

6. A method according to claim 1, further comprising the step of:

forming a sacrifice film on the conductive oxygen barrier film, and then removing the sacrifice film by etching back the sacrifice film and the conductive oxygen barrier film to planarize the conductive oxygen barrier film, before the step of patterning the conductive oxygen barrier film.

7. A method according to claim 6, wherein the sacrifice film is formed by a spin coating.

8. A method according to claim 7, wherein formation of the sacrifice film is executed separately at plural times.

9. A method according to claim 6, wherein a film whose selective etching ratio to the conductive oxygen barrier film is about 1:1 is employed as the sacrifice film.

10. A method according to claim 9, wherein a film made of PZT material is employed as the sacrifice film.

11. A method according to claim 1, wherein the step of forming the insulating oxygen barrier film includes the step of forming an insulating adhesion film.

12. A method according to claim 11, wherein the step of forming the capacitor is executed such that a part of the capacitor lower electrode is formed on the insulating adhesion film.

13. A method according to claim 11, wherein a silicon oxide film or a silicon oxide nitride film is employed as the insulating adhesion film.

14. A method according to claim 1, wherein the step of forming the insulating oxygen barrier film includes the step of forming an oxidation-preventing insulating film on the first insulating film and the patterned conductive oxygen barrier film.

15. A method according to claim 14, wherein a silicon oxide film is employed as the oxidation-preventing insulating film.

16. A method according to claim 2, further comprising the steps of:

forming a second insulating film that covers the capacitor and the insulating oxygen barrier film;

forming a third hole over the second conductive plug by patterning the second insulating film; and burying a third conductive plug, which is electrically connected to the second conductive plug, in the third hole.

* * * * *